(12) United States Patent
Lamotte

(10) Patent No.: US 6,623,903 B2
(45) Date of Patent: Sep. 23, 2003

(54) MATERIAL AND METHOD FOR MAKING AN ELECTROCONDUCTIVE PATTERN

(75) Inventor: Johan Lamotte, Rotselaar (BE)

(73) Assignee: AGFA-Gevaert (BE)

( * ) Notice: Subject to any disclaimer, the term of this patent is extended or adjusted under 35 U.S.C. 154(b) by 0 days.

(21) Appl. No.: 10/174,268

(22) Filed: Jun. 18, 2002

(65) Prior Publication Data

US 2003/0129525 A1 Jul. 10, 2003

Related U.S. Application Data

(60) Provisional application No. 60/309,322, filed on Aug. 1, 2001.

(30) Foreign Application Priority Data

Jun. 22, 2001 (EP) .............................................. 01202423

(51) Int. Cl.⁷ .............................. G03F 7/021; G03F 7/26
(52) U.S. Cl. ....................... 430/158; 430/164; 430/176; 430/188; 430/270.1; 430/311
(58) Field of Search ................................ 430/188, 158, 430/176, 56, 60, 75, 311, 270.1, 164

(56) References Cited

U.S. PATENT DOCUMENTS

| | | | | | |
|---|---|---|---|---|---|
| 5,312,681 A | * | 5/1994 | Muys et al. | ................. | 428/323 |
| 5,354,613 A | * | 10/1994 | Quintens et al. | ............ | 428/341 |
| 5,370,981 A | * | 12/1994 | Krafft et al. | ................ | 430/529 |
| 5,372,924 A | * | 12/1994 | Quintens et al. | ............ | 430/527 |
| 5,391,472 A | * | 2/1995 | Muys et al. | ................. | 430/527 |
| 5,427,841 A | | 6/1995 | De Leeuw et al. | | |
| 6,300,049 B2 | * | 10/2001 | Eichorst et al. | ............. | 430/529 |

FOREIGN PATENT DOCUMENTS

| | | |
|---|---|---|
| EP | 0 686 662 A | 12/1995 |
| EP | 1 079 397 A1 | 2/2001 |
| WO | WO 01/20691 A1 | 3/2001 |

OTHER PUBLICATIONS

Bargon et al.; "Laser processing of electrically conducting polymers into patterns," *Microelectronic Engineering*, vol. 20(1/2), pp. 55–72, (Mar. 1993).
Search Report for EP 01 20 2423 (Dec. 4, 2001).

* cited by examiner

Primary Examiner—John S. Chu
(74) Attorney, Agent, or Firm—Leydig, Voit & Mayer, Ltd.

(57) ABSTRACT

A material for making an electroconductive pattern, the material comprising a support and a light-exposure differentiable element, characterized in that the light-exposure differentiable element comprises a conductivity enhanced outermost layer containing a polyanion and a polymer or copolymer of a substituted or unsubstituted thiophene, and optionally a second layer contiguous with the outermost layer; and wherein the outermost layer and/or the optional second layer contains a monodiazonium salt capable upon exposure of reducing the conductivity of the exposed parts of the outermost layer relative to the unexposed parts of the outermost layer and a method of making an electroconductive pattern.

28 Claims, No Drawings

MATERIAL AND METHOD FOR MAKING AN ELECTROCONDUCTIVE PATTERN

The application claims the benefit of U.S. Provisional Application No. 60/309,322 filed Aug. 1, 2001, which is herein incorporated by reference.

FIELD OF THE INVENTION

The present invention relates to a material and method for making an electroconductive pattern.

BACKGROUND OF THE INVENTION

For the fabrication of flexible LC displays, electroluminescent devices and photovoltaic cells transparent ITO (indium-tin oxide) electrodes are used. These electrodes are made by vacuum sputtering of ITO onto a substrate. This method involves high temperatures, up to 250° C., and therefore glass substrates are generally used. The range of potential applications is limited, because of the high fabrication costs, the low flexibility (pliability) and stretchability as a consequence of the brittleness of the ITO layer and the glass substrate. Therefore the interest is growing in all-organic devices, comprising plastic resins as a substrate and organic electroconductive polymer layers as electrodes. Such plastic electronics allow the realization of low cost devices with new properties (Physics World, March 1999, p.25–39). Flexible plastic substrates can be provided with an electroconductive polymer layer by continuous roller coating methods (compared to batch process such as sputtering) and the resulting organic electrodes enable the fabrication of electronic devices characterised by a higher flexibility and a lower weight.

The production and the use of electroconductive polymers such as polypyrrole, polyaniline, polyacetylene, polyparaphenylene, polythiophene, polyphenylenevinylene, polythienylenevinylene and polyphenylenesulphide are known in the art.

EP-A 440 957 discloses dispersions of polythiophenes, constructed from structural units of formula (I):

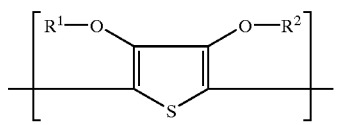

in which $R^1$ and $R^2$ independently of one another represent hydrogen or a $C_{1-4}$-alkyl group or together form an optionally substituted $C_{1-4}$-alkylene residue, in the presence of polyanions. Furthermore, EP-A-686 662 discloses mixtures of A) neutral polythiophenes with the repeating structural unit of formula (I),

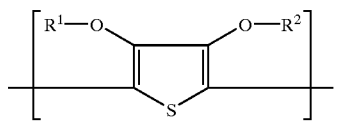

in which $R^1$ and $R^2$ independently of one another represent hydrogen or a C1–C4 alkyl group or together represent an optionally substituted C1–C4 alkylene residue, preferably an optionally with alkyl group substituted methylene, an optionally with C1–C12-alkyl or phenyl group substituted 1,2-ethylene residue or a 1,2-cyclohexene residue, and B) a di- or polyhydroxy- and/or carboxy groups or amide or lactam group containing organic compound; and conductive coatings therefrom which are tempered at elevated temperature, preferably between 100 and 250° C., during preferably 1 to 90 seconds to increase their resistance preferably to <300 ohm/square.

Coated layers of organic electroconductive polymers can be structured into patterns using known microlithography techniques. In WO-A-97 18944 a process is described wherein a positive or negative photoresist is applied on top of a coated layer of an organic electroconductive polymer, and after the steps of selectively exposing the photoresist to UV light, developing the photoresist, etching the electroconductive polymer layer and finally stripping the non-developed photoresist with an organic solvent, a patterned layer is obtained. A similar technique has been described in 1988 in Synthetic Metals, volume 22, pages 265–271 for the design of an all-organic thin-film transistor. Such methods are cumbersome as they involve many steps and require the use of hazardous chemicals.

EP-A 399 299 discloses a structure comprising: a polymeric material; the polymeric material being selected from the group consisting of substituted and unsubstituted polyparaphenylene-vinylenes, polyanilines, polyazines, polythiophenes, poly-p-phenylene sulfides, polyfuranes, polypyrroles, polyselenophenes, polyacetylenes formed from soluble precursors and combinations thereof and blends thereof with other polymers; preselected regions of the polymer material being electrically conductive; the conductive regions being substantially insoluble; and the remainder of the material being substantially soluble.

U.S. Pat. No. 5,427,841 discloses a laminated structure comprising an electrically insulating substrate carrying a polymer layer consisting essentially of a polymer selected from the group of poly(3,4-ethylenedioxythiophene, poly(3,4-diethylenedioxythiophene) wherein the ethylene group is substituted with $C_{1-12}$ alkyl group, poly(3,4-ethylenedioxythiophene) wherein the ethylene group is substituted with an alkoxy group, and oligomers of ethylenedioxy-thiophene, the layer having a sheet resistance of maximally 1000 Ω/square, and a pattern of second substantially non-conductive portions whose sheet resistance is at least a factor of $10^6$ higher than that of the conductive polymer in the first portions, a metal layer being deposited into the electrically conductive first portions of the polymer layer. In Exemplary embodiment 1 surface resistivity differentiation is realized by doping a poly(3,4-ethylenedioxythiophene)-containing layer with imidazole and pattern-wise exposure with UV-light (λ<300 nm) by means of a mercury lamp.

OBJECTS OF THE INVENTION

It is an aspect of the present invention to provide a material having an outermost layer that can be processed to an electroconductive pattern by a simple, convenient method.

SUMMARY OF THE INVENTION

An electroconductive pattern can be realized with the materials of the present invention by pattern-wise exposure without removal of the unexposed or exposed areas, with or without a subsequent single wet processing step. No etching liquids or organic solvents are required.

The aspects of the present invention are realized by a material for making an electroconductive pattern, the material comprising a support and a light-exposure differentiable element, characterized in that the light-exposure differentiable element comprises a conductivity enhanced outermost layer containing a polyanion and a polymer or copolymer of a substituted or unsubstituted thiophene, and optionally a second layer contiguous with the outermost layer; and wherein the outermost layer and/or the optional second layer contains a monodiazonium salt capable upon exposure of reducing the conductivity of the exposed parts of the outermost layer relative to the unexposed parts of the outermost layer.

The aspects of the present invention are further realized by a material for making an electroconductive pattern, the material comprising a support and a light-exposure differentiable element, characterized in that the light-exposure differentiable element comprises an outermost layer having a surface resistance lower than $10^6$ Ω/square containing a polyanion and a polymer or copolymer of a substituted or unsubstituted thiophene, and optionally a second layer contiguous with the outermost layer; and wherein the outermost layer and/or the optional second layer contains a monodiazonium salt capable upon exposure of reducing the conductivity of the exposed parts of the outermost layer relative to the unexposed parts of the outermost layer.

The aspects of the present invention are also realized by a method of making an electroconductive pattern on a support comprising the steps of:

providing a material for making an electroconductive pattern as in the two embodiments disclosed above; and image-wise exposing the material thereby obtaining reduction in the conductivity of the exposed areas relative to non-exposed areas, optionally with a developer.

Further advantages and embodiments of the present invention will become apparent from the following description.

DETAILED DESCRIPTION OF THE INVENTION

The term "support" means a "self-supporting material" so as to distinguish it from a "layer" which may be coated on a support, but which itself is not self-supporting. It also includes any treatment necessary for, or layer applied to aid, adhesion to the light-exposure differentiable element.

The term electroconductive means having a surface resistance below $10^6$ Ω/square. Antistatic materials have surface resistances in the range from $10^6$ to $10^{11}$ Ω/square and cannot be used as an electrode.

Conductivity enhancement refers to a process in which contact with high boiling point liquids such as di- or polyhydroxy- and/or carboxy groups or amide or lactam group containing organic compound optionally followed by heating at elevated temperature, preferably between 100 and 250° C., during preferably 1 to 90 seconds, results in conductivity increase. Alternatively in the case of aprotic compounds with a dielectric constant $\geq 15$, e.g. N-methyl-pyrrolidinone, temperatures below 100° C. can be used. Such conductivity enhancement is observed with polythiophenes and can take place during preparation of the outermost layer or subsequently. Particularly preferred liquids for such treatment are N-methyl-pyrrolidinone and diethylene glycol such as disclosed in EP-A 686 662 and EP-A 1 003 179.

The term light-exposure differentiable element means an element which upon light exposure produces changes in the properties or composition of the exposed parts of the element with respect to the properties or composition of the unexposed parts of the element.

The term diazonium salt includes all compounds with two nitrogen atoms bonded together with a double or triple bond and includes —N≡N$^+$ and —N=N—R groups e.g. —N=N—SO$_3$M groups.

The term surface resistance ratio between exposed and non-exposed areas means the ratio of the surface resistance of the exposed parts (areas) of the outermost layer to the unexposed parts (areas) of the outermost layer after optional processing.

Electroconductive

The term "electroconductive" is related to the electric resistivity of the material. The electric resistance of a layer is generally expressed in terms of surface resistance $R_s$ (unit Ω; often specified as Ω/square). Alternatively, the electroconductance may be expressed in terms of volume resistivity $R_v = R_s \cdot d$, wherein d is the thickness of the layer, volume conductivity $k_v = 1/R_v$ [unit: S(iemens)/cm] or surface conductance $k_s = 1/R_s$ [unit: S(iemens).square].

All values of electric resistance presented herein are measured according to one of the following methods. In the first method the support coated with the electroconductive outermost layer is cut to obtain a strip having a length of 27.5 cm and a width of 35 mm and strip electrodes are applied over its width at a distance of 10 cm perpendicular to the edge of the strip. The electrodes are made of an electroconductive polymer, ECCOCOAT CC-2 available from Emerson & Cumming Speciality polymers. Over the electrode a constant potential is applied and the current flowing through the circuit is measured on a pico-amperometer KEITHLEY 485. From the potential and the current, taking into account the geometry of the area between the electrodes, the surface resistance in Ω/square is calculated.

In the second method, the surface resistance was measured by contacting the outermost layer with parallel copper electrodes each 35 mm long and 35 mm apart capable of forming line contacts, the electrodes being separated by a teflon insulator. This enables a direct measurement of the surface resistance.

Support

Supports for use according to the present invention include polymeric films, silicon, ceramics, oxides, glass, polymeric film reinforced glass, glass/plastic laminates, metal/plastic laminates, paper and laminated paper, optionally treated, provided with a subbing layer or other adhesion promoting means to aid adhesion to the light-exposure differentiable element. Suitable polymeric films are poly(ethylene terephthalate), poly(ethylene naphthalate), polystyrene, polyethersulphone, polycarbonate, polyacrylate, polyamide, polyimides, cellulosetriacetate, polyolefins and polyvinylchloride, optionally treated by corona discharge or glow discharge or provided with a subbing layer.

Light-exposure Differentiable Element

A light-exposure differentiable element, according to the present invention, is an element which upon light exposure produces changes in the properties or composition of the exposed parts of the element with respect to the properties or composition of the unexposed parts of the element. According to the present invention, these changes in the properties or composition of the light-exposure differentiable element are due to the presence of a monodiazonium salt in the outermost layer and/or optional contiguous second layer, which upon exposure increases the surface resistance of the exposed areas. The optional second layer must be between the outermost layer and the support as it cannot be the outermost layer. Combinations of monodiazonium salt can also be used. Increasing the pH of the coating dispersions and solutions used in preparing the light-exposure differentiable element has been found to improve the shelf-life of materials according to the present invention. pH's between 2.5 and 9 are preferred, with pH's between 3 and 6 being particularly preferred. Such pH's can, for example, be advantageously realized by adding ammonium hydroxide.

Polymer or Copolymer of a Substituted or Unsubstituted Thiophene

In a first embodiment of the material according to the present invention the polymer of a substituted or unsubstituted thiophene corresponds to the formula (I):

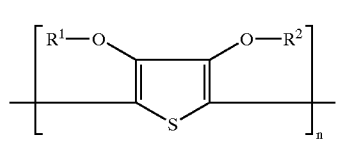

in which n is larger than 1 and each of $R^1$ and $R^2$ independently represents hydrogen or an optionally substituted $C_{1-4}$ alkyl group or together represent an optionally substituted $C_{1-4}$ alkylene group or an optionally substituted cycloalkylene group, preferably an ethylene group, an optionally alkyl-substituted methylene group, an optionally $C_{1-12}$ alkyl- or phenyl-substituted ethylene group, a 1,3-propylene group or a 1,2-cyclohexylene group.

The preparation of such a polythiophene and of aqueous dispersions containing such a polythiophene and a polyanion is described in EP-A-440 957 and corresponding US-P-5 300 575. Basically the preparation of polythiophene proceeds in the presence of polymeric polyanion compounds by oxidative polymerisation of 3,4-dialkoxythiophenes or 3,4-alkylenedioxythiophenes according to the following formula:

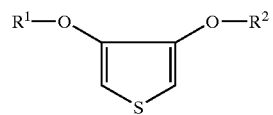

wherein $R^1$ and $R^2$ are as defined above.

Stable aqueous polythiophene dispersions having a solids content of 0.05 to 55% by weight and preferably of 0.1 to 10% by weight can be obtained by dissolving thiophenes corresponding to the formula above, a polyacid and an oxidising agent in an organic solvent or preferably in water, optionally containing a certain amount of organic solvent, and then stirring the resulting solution or emulsion at 0° C. to 100° C. until the polymerisation reaction is completed. The polythiophenes formed by the oxidative polymerisation are positively charged, the location and number of such positive charges being not determinable with certainty and therefore not mentioned in the general formula of the repeating units of the polythiophene polymer.

The oxidising agents are those which are typically used for the oxidative polymerisation of pyrrole as described in for example J. Am. Soc. 85, 454 (1963). Preferred inexpensive and easy-to-handle oxidising agents are iron(III) salts, e.g. $FeCl_3$, $Fe(ClO_4)_3$ and the iron(III) salts of organic acids and inorganic acids containing organic residues. Other suitable oxidising agents are $H_2O_2$, $K_2Cr_2O_7$, alkali or ammonium persulphates, alkali perborates, potassium permanganate and copper salts such as copper tetrafluoroborate. Air or oxygen can also be used as oxidising agents. Theoretically, 2.25 equivalents of oxidising agent per mol of thiophene are required for the oxidative polymerisation thereof (J. Polym. Sci. Part A, Polymer Chemistry, Vol. 26, p.1287, 1988). In practice, however, the oxidising agent is used in excess, for example, in excess of 0.1 to 2 equivalents per mol of thiophene.

Polyanion

The polyacid forms a polyanion or, alternatively, the polyanion can be added as a salt of the corresponding polyacids, e.g. as an alkali salt. Preferred polyacids or salts thereof are polymeric carboxylic acids such as poly(acrylic acid), poly((meth)acrylic acid) and poly(maleic acid) or polymeric sulphonic acids such as poly(styrene sulphonic acid) or poly(vinyl sulphonic acid). Alternatively, copolymers of such carboxylic and/or sulphonic acids and of other polymerizable monomers such as styrene or acrylates can be used.

In a second embodiment of the material according to the present invention the polyanion is poly(styrene sulphonate).

The molecular weight of these polyanion forming polyacids is preferably between 1000 and $2 \times 10^6$, more preferably between 2000 and $5 \times 10^5$. These polyacids or their alkali salts are commercially available and can be prepared according to the known methods, e.g. as described in Houben-Weyl, Methoden der Organische Chemie, Bd. E20 Makromolekulare Stoffe, Teil 2, (1987), pp. 1141.

Dispersion of a Polyanion and a Polymer or Copolymer of a Substituted or Unsubstituted Thiophene The coating dispersion or solution of a polyanion and a polymer or copolymer of a substituted or unsubstituted thiophene can also comprise additional ingredients, such as one or more binders, one or more surfactants, spacing particles, UV-filters or IR-absorbers.

Anionic and non-ionic surfactants are preferred. Suitable surfactants include ZONYL™ FSN 100 and ZONYL™ FSO 100, an ethoxylated non-ionic fluoro-surfactant with the structure: $F(CF_2CF_2)_yCH_2CH_2O(CH_2CH_2O)_xH$, where x=0 to ca. 15 and y=1 to ca. 7, both from Du Pont.

Suitable polymer binders are described in EP-A 564 911. Such binders may be treated with a hardening agent, e.g. an epoxysilane such as 3-glycidyloxypropyltrimethoxysilane as described in EP-A 564 911, which is especially suitable when coating on a glass substrate.

The coating dispersion or solution of a polyanion and a polymer or copolymer of a substituted or unsubstituted thiophene preferably also comprises an organic compound that is: a linear, branched or cyclic aliphatic $C_{2-20}$ hydrocarbon or an optionally substituted aromatic $C_{6-14}$ hydrocarbon or a pyran or a furan, the organic compound comprising at least two hydroxy groups or at least one —COX or —CONYZ group wherein X denotes —OH and Y and Z independently of one another represent H or alkyl; or a heterocyclic compound containing at least one lactam group. Examples of such organic compounds are e.g. N-methyl-2-pyrrolidinone, 2-pyrrolidinone, 1,3-dimethyl-2-imidazolidone, N,N,N',N'-tetramethylurea, formamide, dimethylformamide, and N,N-dimethylacetamide. Preferred examples are sugar or sugar derivatives such as arabinose, saccharose, glucose, fructose and lactose, or di- or polyalcohols such as sorbitol, xylitol, mannitol, mannose, galactose, sorbose, gluconic acid, ethylene glycol, di- or tri(ethylene glycol), 1,1,1-trimethylol-propane, 1,3-propanediol, 1,5-pentanediol, 1,2,3-propantriol, 1,2,4- butantriol, 1,2,6-hexantriol, or aromatic di- or polyalcohols such as resorcinol.

Monodiazonium Salt

In a third embodiment of the material according to the present invention the monodiazonium salts used in the present invention is a monoaryldiazoniumsulphonate salt.

In an fourth embodiment of the material according to the present invention the monodiazoniumsulphonate salt is represented by formula (II):

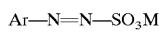

(II)

where Ar is a substituted or unsubstituted aryl group; and M is a cation. Ar preferably represents an unsubstituted phenyl group or a phenyl group substituted with one or more alkyl groups, substituted alkyl groups, aryl groups, alkoxy groups, aryloxy groups, amino groups or substituted amino groups, which may be linked with one another to form an alicylic or heterocyclic ring. M preferably represents a cation such as $NH_4^+$ or a metal ion such as a cation of Al, Cu, Zn, an alkaline earth metal or alkali metal.

Suitable monoaryldiazoniumsulphonate salts according to formula (II) are:

| | $\lambda_{max}$ [nm] | absorption of 1% solution in water | |
|---|---|---|---|
| MADS01 | 332 | 1.237 | |
| MADS02 | 332 | 1.611 | |
| MADS03 | 358 | 1.368 | |
| MADS04 | 370 | 0.433 | |
| MADS05 | | | |

| | $\lambda_{max}$ [nm] | absorption of 1% solution in water |
|---|---|---|

MADS06 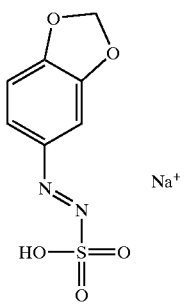

MADS07 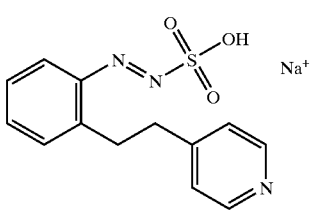

MADS08 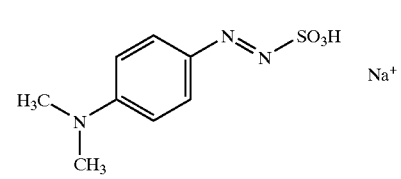

In a fifth embodiment of the material according to the present invention the monodiazonium salt is MADS01 or MADS06.

Binders

In the materials for making an electroconductive pattern, according to the present invention, the light-exposure differentiable element contains a binder.

In a sixth embodiment of the material according to the present invention the outermost layer contains a binder, e.g. polyvinyl alcohol and a hydroxyethyl methacrylate copolymer.

In a seventh embodiment of the material according to the present invention the optional second layer contains a binder, e.g. polyvinyl alcohol and a hydroxyethyl methacrylate copolymer.

Suitable binders for use in the present invention are described in EP-A 564 911 and include water-soluble polymers, such as poly(vinyl alcohol), water-soluble homo- and co-polymers of acrylic acid and homo- and co-polymers of methacrylic acid, and polymer latexes. Preferred binders include poly(vinyl alcohol) and homo- and co-polymers of hydroxyethyl methacrylate and copolymers of 2-propenoic acid 2-phosphonooxy)ethyl ester, copolymers of 2-methyl-2-propenoic acid 2-phosphonooxy)ethyl ester. Such binders may be treated with a hardening agent, e.g. an epoxysilane such as 3-glycidyloxypropyltrimethoxysilane as described in EP-A 564 911, which is especially suitable when coating on a glass substrate.

Exposure Process

The material of the present invention can be image-wise exposed to ultraviolet light optionally in combination with blue light in the wavelength range of 250 to 500 nm or infrared light. Upon image-wise exposure, a differentiation of the surface resistance optionally with a developer of the exposed and non-exposed areas is induced. Useful exposure sources are high or medium pressure halogen mercury vapour lamps, e.g. of 1000 W or lasers having an emission wavelength in the range from about 700 to about 1500 nm, such as a semiconductor laser diode, a Nd:YAG or a Nd:YLF laser.

Development Process

After the image-wise exposure the material is optionally rinsed in a developer, which can be plain water or is preferably water-based, to remove residual monodiazonium salt. During this rinsing process the outermost layer remains intact.

While the present invention will hereinafter be described in connection with preferred embodiments thereof, it will be understood that it is not intended to limit the invention to those embodiments. All percentages given in the EXAMPLES are percentages by weight unless otherwise stated.

EXAMPLES

Ingredients used in the light-exposure differentiable element which are not mentioned above:

| | |
|---|---|
| PEDOT = | poly(3,4-ethylenedioxythiophene) |
| PSS = | poly(styrene sulphonic acid) |
| LATEX01 = | vinylidene chloride, methyl methacrylate, itaconic acid (88/10/2) terpolymer, available as a 30% aqueous dispersion |

-continued

| | |
|---|---|
| Z6040 = | 3-glycidoxypropyltrimethoxysilane from DOW CORNING |
| ZONYL ™ FSO 100 = | an ethoxylated non-ionic fluoro-surfactant with the structure: $F(CF_2CF_2)_yCH_2CH_2O(CH_2CH_2O)_xH$, where x = 0 to ca. 15 and y = 1 to ca. 7 from Du Pont |

Ingredients used in the subbing layers:

| | |
|---|---|
| KIESELSOL 100F = | a colloid silica from BAYER, available as a 30% aqueous dispersion; |
| MERSOLAT ™H76 = | a sodium pentadecylsulfonate by BAYER, supplied as a 76% concentrate; |
| ULTRAVON ™ W = | a sodium arylsulfonate from CIBA-GEIGY, supplied as a 75–85% concentrate; |

The following support based on 100 μm polyethylene terephthalate film was used in the EXAMPLES:

| Support nr. | Composition |
|---|---|
| 01 | subbing layer consisting of 79.1% LATEX01; 18.6% KIESELSOL 100F; 0.5% MERSOLAT H; and 1.9% ULTRAVON W |

PEDOT/PSS Dispersion

The aqueous dispersions of poly(3,4-ethylenedioxy-thiophene)/poly(styrene sulphonate) (PEDOT/PSS) in a weight ratio of 1:2.4 (1:1.9 on molar basis) used in the EXAMPLES were prepared according to the method described in EP-A-1 079 397, herein incorporated by reference. The particle size of the PEDOT/PSS latex was determined by CPS DCP2000 disc centrifuge measurements to be narrow with a maximum at 25 nm with an average particle size of 30–50 nm.

Example 1

EXAMPLE 1 discloses the evaluation of different monoaryldiazonium salts: MADS01 to 04, MADS07 and MADS08 incorporated in the PEDOT/PSS-containing outermost layer. Samples I to VIII were prepared by coating Support nr. 1 with the dispersions given in Table 1 to a wet thickness of 40 μm followed by drying at 50° C. for 5 minutes.

TABLE 1

| | SAMPLE | | | | | | | |
|---|---|---|---|---|---|---|---|---|
| INGREDIENT [g] | I (COMP) | II | III | IV | V | VI | VII | VIII |
| 1,2% aq PEDOT/PSS disp. | 41.7 | 41.7 | 41.7 | 41.7 | 41.7 | 41.7 | 41.7 | 41.7 |
| MADS01 | — | 0.25 | — | — | — | — | — | — |
| 1% aq. sol. of MADS01 | — | — | 25 | — | — | — | — | — |
| MADS02 | — | — | — | 0.25 | — | — | — | — |
| MADS03 | — | — | — | — | 0.25 | — | — | — |
| MADS04 | — | — | — | — | — | 0.25 | — | — |
| 1% aq. sol. of MADS07 | — | — | — | — | — | — | 25 | — |
| MADS08 | — | — | — | — | — | — | — | 0.25 |
| N-methyl-pyrrolidinone | 5 | 5 | 5 | 5 | 5 | 5 | 5 | 5 |
| 2% aq sol ZONYL ™ FSO 100 | 1 | 1 | 1 | 1 | 1 | 1 | 1 | 1 |
| 0.25% aqueous NH$_4$OH | — | — | 8.0 | — | — | — | — | — |
| 2.5% aqueous NH$_4$OH | 0.9 | 0.9 | — | 0.9 | 0.9 | 0.9 | 0.9 | 0.9 |
| deionized water | 51.4 | 51.15 | 19.3 | 51.15 | 51.15 | 51.15 | 26.4 | 51.15 |
| pH | 2.6–2.8 | 2.6–2.8 | 3.58 | 2.6–2.8 | 2.6–2.8 | 2.6–2.8 | 2.6–2.8 | 2.6–2.8 |

The resulting ingredient coverages with Samples I to VIII are given in Table 2.

TABLE 2

| | SAMPLE | | | | | | | |
|---|---|---|---|---|---|---|---|---|
| INGREDIENT COVERAGE [mg/m$^2$] | I (COMP) | II | III | IV | V | VI | VII | VIII |
| PEDOT/PSS | 200 | 200 | 200 | 200 | 200 | 200 | 200 | 200 |
| MADS01 | — | 100 | 100 | — | — | — | — | — |
| MADS02 | — | — | — | 100 | — | — | — | — |
| MADS03 | — | — | — | — | 100 | — | — | — |
| MADS04 | — | — | — | — | — | 100 | — | — |
| MADS07 | — | — | — | — | — | — | 100 | — |
| MADS08 | — | — | — | — | — | — | — | 100 |
| ZONYL ™ FSO 100 | 8 | 8 | 8 | 8 | 8 | 8 | 8 | 8 |

The layers of Samples I to VIII were exposed through a mask on a PRINTON™ CDL 1502i UV contact exposure unit (from AGFA-GEVAERT N.V.) for 400 s at 4 mW/cm$^2$ (=exposure of 1.6 J/cm$^2$) with the samples above the glass filter, rinsed for 4 minutes with deionized water at room temperature and finally dried for 4 minutes at 50° C. No difference was observed in the surface resistances observed whether exposure times of 100 s or 400 s were used as long as subsequent rinsing with water was carried out. Furthermore, the degradation process appeared to continue if the material was contacted with water.

The surface resistances of the non-exposed and exposed areas of the light-exposure differentiable element before and after rinsing with water are given in Table 3.

All samples containing mono(aryldiazosulphonate) compounds exhibited a differentiation in surface resistance ($R_s$) between exposed and unexposed areas, whereas no differentiation was observed for Sample I in which no mono (aryldiazosulphonate) compound was present in the PEDOT/PSS-containing outermost layer.

Moderate differentiation was observed in the cases of Samples IV and V containing MADS02 and MADS03 respectively and a factor greater than 5000 was observed in the case of Samples II and III containing MADS01.

TABLE 3

| | SAMPLE | | | | | | | |
|---|---|---|---|---|---|---|---|---|
| | I (COMP) | II | III | IV | V | VI | VII | VIII |
| $R_s$ of exposed layer untreated with water [Ω/square] | 2.2 × 10$^3$ | 9.1 × 10$^7$ | 5.9 × 10$^7$ | 7.6 × 10$^4$ | 2.8 × 10$^5$ | 1.2 × 10$^4$ | 5.4 × 10$^3$ | 4.1 × 10$^4$ |
| $R_s$ of exposed layer treated with water [Ω/square] | 3.3 × 10$^3$ | 3.6 × 10$^8$ | 8.1 × 10$^7$ | 2.1 × 10$^5$ | 4.2 × 10$^5$ | 2.5 × 10$^4$ | 1.3 × 10$^4$ | 7.3 × 10$^4$ |
| $R_s$ of non-exposed non-water treated layer [Ω/square] | 2.1 × 10$^3$ | 1.3 × 10$^4$ | 1.1 × 10$^4$ | 5.3 × 10$^3$ | 1.0 × 10$^4$ | 5.5 × 10$^3$ | 8.3 × 10$^2$ | 8.9 × 10$^3$ |
| $R_s$ of non-exposed layer treated with water [Ω/square] | 2.9 × 10$^3$ | 2.9 × 10$^4$ | 1.5 × 10$^4$ | 7.8 × 10$^3$ | 1.5 × 10$^4$ | 9.4 × 10$^3$ | 1.4 × 10$^3$ | 1.2 × 10$^4$ |
| ratio of exposed layer to unexposed layer after treatment with water | 1.14 | 12,414 | 5400 | 26.9 | 28 | 2.7 | 9.3 | 6.08 |

Example 2

EXAMPLE 2 discloses the evaluation of different monoaryldiazonium salts: MADS05 to 07 incorporated in the PEDOT/PSS-containing outermost layer. Samples IX to XIV were prepared by coating Support nr. 1 with the dispersions given in Table 4 to a wet thickness of 40 μm followed by drying at 50° C. for 5 minutes.

TABLE 4

| | SAMPLE | | | | | |
|---|---|---|---|---|---|---|
| INGREDIENT [g] | IX (COMP) | X | XI | XII | XIII | XIV |
| 1, 2% aq. PEDOT/PSS disper. | 41.7 | 41.7 | 41.7 | 41.7 | 41.7 | 41.7 |
| 1% aq. solution of MADS05 | — | 25 | — | — | — | — |

TABLE 4-continued

| | SAMPLE | | | | | |
|---|---|---|---|---|---|---|
| INGREDIENT [g] | IX (COMP) | X | XI | XII | XIII | XIV |
| 1% aq. solution of MADS06 | — | — | 25 | 28.2 | — | — |
| 1% aq. solution of MADS07 | — | — | — | — | 25 | 50 |
| N-methylpyrrolidinone | 5 | 5 | 5 | 5 | 5 | 5 |
| 2% aq. sol. ZONYL ™FSO 100 | 1 | 1 | 1 | 1 | 1 | 1 |
| 0.25% aqueous NH$_4$OH | 9.0 | — | — | 10 | — | — |
| 2.5% aqueous NH$_4$OH | — | 0.9 | 0.9 | — | 0.9 | 0.9 |
| deionized water | 43.3 | 26.4 | 26.4 | 14.1 | 26.4 | 1.4 |
| pH | 3.31 | 2.31 | 2.33 | 3.17 | 2.35 | 2.6–2.8 |

The ingredient coverages of the dried layers of Samples IX to XIV are given in Table 5.

TABLE 5

| | SAMPLE | | | | | |
|---|---|---|---|---|---|---|
| INGREDIENT COVERAGE [mg/m$^2$] | IX (COMP) | X | XI | XII | XIII | XIV |
| PEDOT/PSS | 200 | 200 | 200 | 200 | 200 | 200 |
| MADS05 | — | 100 | — | — | — | — |
| MADS06 | — | — | 100 | 113 | — | — |
| MADS07 | — | — | — | — | 100 | 200 |
| ZONYL ™ FSO 100 | 8 | 8 | 8 | 8 | 8 | 8 |

The layers of Samples IX to XIV were exposed through a mask on a PRINTON™ CDL 1502i UV contact exposure unit (from AGFA-GEVAERT N.V.) for 400 s at 4 mW/cm$^2$ (=exposure of 1.6 J/cm$^2$) with the samples above the glass filter, rinsed for 4 minutes with deionized water at room temperature and finally dried for 4 minutes at 50° C. The surface resistances of the non-exposed and exposed areas of the light-exposure differentiable element before and after rinsing with water are given in Table 6.

TABLE 6

| | SAMPLE | | | | | |
|---|---|---|---|---|---|---|
| | IX (COMP) | X | XI | XII | XIII | XIV |
| $R_s$ of exposed layer untreated with water [Ω/square] | $1.3 \times 10^3$ | $2.4 \times 10^3$ | $1.6 \times 10^6$ | $1.0 \times 10^8$ | $2.9 \times 10^3$ | $1.6 \times 10^4$ |
| $R_s$ of exposed layer treated with water [Ω/square] | $1.5 \times 10^3$ | $4.5 \times 10^3$ | $3.0 \times 10^6$ | $1.6 \times 10^8$ | $3.8 \times 10^3$ | $3.6 \times 10^4$ |
| $R_s$ of non-exposed layer untreated with water [Ω/square] | $1.5 \times 10^3$ | $1.2 \times 10^3$ | $3.2 \times 10^3$ | $9.5 \times 10^3$ | $7.8 \times 10^2$ | $1.0 \times 10^3$ |
| $R_s$ of non-exposed layer treated with water [Ω/square] | $1.5 \times 10^3$ | $1.5 \times 10^3$ | $5.1 \times 10^3$ | $1.2 \times 10^4$ | $8.4 \times 10^2$ | $1.2 \times 10^3$ |
| ratio of exposed layer to unexposed layer after treatment with water | 1.0 | 3.0 | 588 | 13,333 | 4.5 | 30 |

All samples containing mono(aryldiazosulphonate) compounds exhibited a differentiation in surface resistance ($R_s$) between exposed and unexposed areas, whereas no differentiation was observed for Sample IX in which no mono (aryldiazosulphonate) compound was present in the PEDOT/PSS-containing outermost layer.

Moderate differentiation was observed in the cases of the layer of Sample XIV containing MADS07 and a factor greater than $10^4$ was observed in the case of layer of Sample XII containing MADS06.

Example 3

EXAMPLE 3 discloses the evaluation of different monoaryldiazonium salts: MADS01 incorporated in the PEDOT/PSS-containing outermost layer in different concentrations. Samples XV to XX were prepared by coating Support nr. 1 with the dispersions given in Table 7 to a wet thickness of 40 μm. The ingredient coverages in Samples XV to XIX after drying at 50° C. for 5 minutes are also given in Table 7.

The layers of Samples XV to XX were exposed through a mask on a PRINTON™ CDL 1502i UV contact exposure unit (from AGFA-GEVAERT N.V.) for 400 s at 4 mW/cm² (=exposure of 1.6 J/cm²) with the samples above the glass filter, rinsed for 4 minutes with deionized water at room temperature and finally dried for 4 minutes at 50° C. The surface resistances of the non-exposed and exposed areas of the light-exposure differentiable element before and after rinsing with water are given in Table 8.

TABLE 8

| | XV (COMP) | XVI | XVII | XVIII | XIX | XX |
|---|---|---|---|---|---|---|
| $R_s$ of exposed layer untreated with water [Ω/square] | $2.2 \times 10^3$ | $6.6 \times 10^3$ | $1.0 \times 10^5$ | $3.0 \times 10^6$ | $1.0 \times 10^7$ | $1.1 \times 10^8$ |
| $R_s$ of exposed layer treated with water [Ω/square] | $2.9 \times 10^3$ | $1.1 \times 10^4$ | $2.7 \times 10^5$ | $7.7 \times 10^6$ | $7.0 \times 10^7$ | $3.5 \times 10^8$ |
| surface resistance of non-exposed layer untreated with water [Ω/square] | $2.1 \times 10^3$ | $2.7 \times 10^3$ | $3.9 \times 10^3$ | $7.6 \times 10^3$ | $1.8 \times 10^4$ | $7.9 \times 10^4$ |
| $R_s$ of non-exposed layer treated with water [Ω/square] | $2.7 \times 10^3$ | $3.7 \times 10^3$ | $5.6 \times 10^3$ | $1.1 \times 10^4$ | $2.8 \times 10^4$ | $1.7 \times 10^5$ |
| ratio of exposed layer to unexposed layer treated with water | 1.07 | 2.97 | 48.2 | 700 | 2500 | 2059 |

The results in Table 8 show that the differentiation in surface resistance ($R_s$) between exposed and unexposed areas increased with MADS01 concentration up to 50% by weight of MADS01 with respect to PEDOT/PSS.

Example 4

EXAMPLE 4 discloses the influence of two conductivity enhancing agents: N-methyl-pyrrolidinone and diethylene glycol. Samples XXI to XXIII were prepared by coating Support nr. 1 with the dispersions given in Table 9 to a wet thickness of 40 μm. The ingredient coverages in Samples XXI to XXIII after drying at 50° C. for 5 minutes for Samples XXI and XXII and 110° C. for 5 minutes for Sample XXIII are also given in Table 9.

TABLE 7

| | XV (COMP) | XVI | XVII | XVIII | XIX | XX |
|---|---|---|---|---|---|---|
| 1, 2% aqueous dispersion of PEDOT/PSS [g] | 41.7 | 41.7 | 41.7 | 41.7 | 41.7 | 41.7 |
| 2% aqueous solution of ZONYL ™ FSO 100 [g] | 1 | 1 | 1 | 1 | 1 | 1 |
| N-methyl-pyrrolidinone [g] | 5 | 5 | 5 | 5 | 5 | 5 |
| MADS01 [g] | 0 | 0.025 | 0.0625 | 0.125 | 0.25 | 0.5 |
| deionized water [g] | 51.02 | 51.00 | 50.96 | 50.90 | 50.99 | 51.12 |
| 2.5% aqueous NH₄OH [g] | 1.28 | 1.28 | 1.28 | 1.28 | 1.06 | 0.68 |
| pH | 3.41 | 3.3 | 3.17 | 3.45 | 3.53 | 3.55 |
| coverage | | | | | | |
| PEDOT/PSS [mg/m²] | 200 | 200 | 200 | 200 | 200 | 200 |
| MADS01 [mg/m²] | 0 | 10 | 25 | 50 | 100 | 200 |
| % by weight of MADS01 w.r.t. PEDOT/PSS | 0 | 5 | 12.5 | 25 | 50 | 100 |
| ZONYL ™ FSO 100 [mg/m²] | 8 | 8 | 8 | 8 | 8 | 8 |

TABLE 9

| INGREDIENT [g] | SAMPLE | | |
|---|---|---|---|
| | XXI (COMP) | XXII | XXIII |
| 1, 2% aq. PEDOT/PSS dispersion | 41.7 | 41.7 | 41.7 |
| 2% aq. sol. of ZONYL ™ FSO 100 | 1 | 1 | 1 |
| N-methyl-pyrrolidinone | — | 5 | — |
| Diethylene glycol | — | — | 5 |
| MADS01 | 0.25 | 0.25 | 0.25 |
| deionized water | 57.0 | 52.05 | 52.05 |
| COVERAGE | | | |
| PEDOT/PSS [mg/m$^2$] | 200 | 200 | 200 |
| MADS01 [mg/m$^2$] | 100 | 100 | 100 |
| ZONYL ™ FSO 100 [mg/m$^2$] | 8 | 8 | 8 |

The layers of Samples XXI to XXIII were exposed through a mask on a PRINTON™ CDL 1502i UV contact exposure unit (from AGFA-GEVAERT N.V.) for 400 s at 4 mW/cm$^2$ (=exposure of 1.6 J/cm$^2$) with the samples above the glass filter, rinsed for 4 minutes with deionized water at room temperature and finally dried for 4 minutes at 50° C. The surface resistances of the non-exposed and exposed areas of the light-exposure differentiable element before and after rinsing with water are given in Table 10.

TABLE 10

| | XX (COMP) | XXI | XXII |
|---|---|---|---|
| R$_s$ of exposed layer untreated with water [Ω/square] | 1.3 × 10$^7$ | 2.1 × 10$^6$ | 1.9 × 10$^4$ |
| R$_s$ of exposed layer treated with water [Ω/square] | 1.6 × 10$^{14*}$ | 1.4 × 10$^7$ | 2.4 × 10$^6$ |
| R$_s$ of non-exposed non-water treated layer [Ω/square] | 8.4 × 10$^5$ | 1.3 × 10$^4$ | 2.4 × 10$^4$ |
| R$_s$ of non-exposed layer treated with water [Ω/square] | 1.3 × 10$^{14*}$ | 2.4 × 10$^4$ | 2.0 × 10$^6$ |
| R$_s$ ratio of exposed layer to unexposed layer treated with water | 1.23 | 583.3 | 1.2 |

*layer is completely removed when surface resistance is 10$^{14}$ Ω/square

The adhesion of the light-exposure differentiable element of Sample XXI, a comparative example, was clearly insufficient to withstand rinsing with water.

The differentiation of surface resistance in the case of Sample XXII using N-methyl-pyrrolidinone as conductivity enhancing agent was significantly lower than those observed for Samples II, III and XIX.

No differentiation of surface resistance was observed in the case of Sample XXIII, which is believed to be due to degradation or reaction of MADS01 in the presence of the diethylene glycol during the drying process at 110° C.

The present invention may include any feature or combination of features disclosed herein either implicitly or explicitly or any generalisation thereof irrespective of whether it relates to the presently claimed invention. In view of the foregoing description it will be evident to a person skilled in the art that various modifications may be made within the scope of the invention.

I claim:

1. A material for making an electroconductive pattern, said material comprising a support and a light-exposure differentiable element, characterized in that said light-exposure differentiable element comprises a conductivity enhanced outermost layer containing a polyanion and a polymer or copolymer of a substituted or unsubstituted thiophene, and optionally a second layer contiguous with said outermost layer; and wherein said outermost layer and/or said optional second layer contains a monodiazonium salt capable upon exposure of reducing the conductivity of the exposed parts of said outermost layer relative to the unexposed parts of said outermost layer.

2. Material according to claim 1, wherein said polymer of a substituted or unsubstituted thiophene corresponds to the following formula:

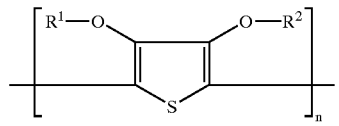

in which n is larger than 1 and each of R$^1$ and R$^2$ independently represent hydrogen or an optionally substituted C$_{1-4}$ alkyl group or together represent an optionally substituted C$_{1-4}$ alkylene group or an optionally substituted cycloalkylene group, preferably an ethylene group, an optionally alkyl-substituted methylene group, an optionally C$_{1-12}$ alkyl- or phenyl-substituted ethylene group, a 1,3-propylene group or a 1,2-cyclohexylene group.

3. Material according to claim 1, wherein said polyanion is poly(styrene sulphonate).

4. Material according to claim 1, wherein said outermost layer further contains a binder.

5. Material according to claim 1, wherein said monodiazonium salt capable upon exposure of reducing the conductivity of the exposed parts of said outermost layer relative to the unexposed parts of said outermost layer is a mono (aryldiazosulphonate) salt.

6. Material according to claim 5, wherein said mono (aryldiazosulphonate) salt is

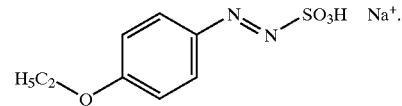

7. Material according to claim 5, wherein said mono (aryldiazosulphonate) salt is

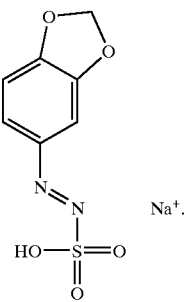

8. A method of making an electroconductive pattern on a support comprising the steps of:
providing a material for making an electroconductive pattern, said material comprising a support and a light-exposure differentiable element, characterized in that said light-exposure differentiable element comprises a conductivity enhanced outermost layer containing a polyanion and a polymer or copolymer of a substituted or unsubstituted thiophene, and optionally a second layer contiguous with said outermost layer; and wherein said outermost layer and/or said optional second layer contains a monodiazonium salt capable upon exposure of reducing the conductivity of the exposed parts of said outermost layer relative to the unexposed parts of said outermost layer; and image-wise exposing the material thereby obtaining reduction in the conductivity of the exposed areas relative to non-exposed areas, optionally with a developer.

9. Method according to claim 8, wherein said polymer of a substituted or unsubstituted thiophene corresponds to the following formula:

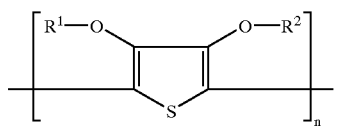

in which n is larger than 1 and each of $R^1$ and $R^2$ independently represent hydrogen or an optionally substituted $C_{1-4}$ alkyl group or together represent an optionally substituted $C_{1-4}$ alkylene group or an optionally substituted cycloalkylene group, preferably an ethylene group, an optionally alkyl-substituted methylene group, an optionally $C_{1-12}$ alkyl- or phenyl-substituted ethylene group, a 1,3-propylene group or a 1,2-cyclohexylene group.

10. Method according to claim 8, wherein said polyanion is poly(styrene sulphonate).

11. Method according to claim 8, wherein said outermost layer further contains a binder.

12. Method according to claim 8, wherein said monodiazonium salt capable upon exposure of reducing the conductivity of the exposed parts of said outermost layer relative to the unexposed parts of said outermost layer is a mono(aryldiazosulphonate) salt.

13. Method according to claim 12, wherein said mono(aryldiazosulphonate) salt is

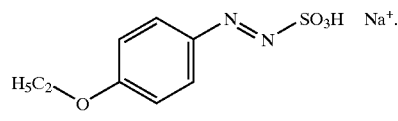

14. Method according to claim 12, wherein said mono(aryldiazosulphonate) salt is

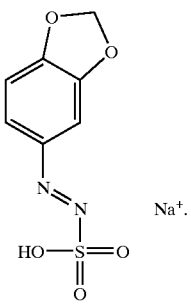

15. A material for making an electroconductive pattern, said material comprising a support and a light-exposure differentiable element, characterized in that said light-exposure differentiable element comprises an outermost layer having a surface resistance lower than $10^6$ Ω/square containing a polyanion and a polymer or copolymer of a substituted or unsubstituted thiophene, and optionally a second layer contiguous with said outermost layer; and wherein said outermost layer and/or said optional second layer contains a monodiazonium salt capable upon exposure of reducing the conductivity of the exposed parts of said outermost layer relative to the unexposed parts of said outermost layer.

16. Material according to claim 15, wherein said polymer of a substituted or unsubstituted thiophene corresponds to the following formula:

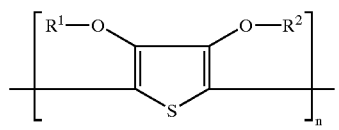

in which n is larger than 1 and each of $R^1$ and $R^2$ independently represent hydrogen or an optionally substituted $C_{1-4}$ alkyl group or together represent an optionally substituted $C_{1-4}$ alkylene group or an optionally substituted cycloalkylene group, preferably an ethylene group, an optionally alkyl-substituted methylene group, an optionally $C_{1-12}$ alkyl- or phenyl-substituted ethylene group, a 1,3-propylene group or a 1,2-cyclohexylene group.

17. Material according to claim 15, wherein said polyanion is poly(styrene sulphonate).

18. Material according to claim 15, wherein said outermost layer further contains a binder.

19. Material according to claim 15, wherein said monodiazonium salt capable upon exposure of reducing the conductivity of the exposed parts of said outermost layer relative to the unexposed parts of said outermost layer is a mono(aryldiazosulphonate) salt.

20. Material according to claim 19, wherein said mono(aryldiazosulphonate) salt is

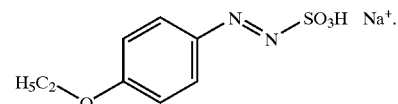

21. Material according to claim 19, wherein said mono(aryldiazosulphonate) salt is

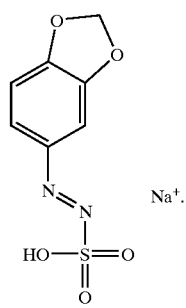

22. A method of making an electroconductive pattern on a support comprising the steps of:

providing a material for making an electroconductive pattern, said material comprising a support and a light-exposure differentiable element, characterized in that said light-exposure differentiable element comprises an outermost layer having a surface resistance lower than $10^6$ Ω/square containing a polyanion and a polymer or copolymer of a substituted or unsubstituted thiophene, and optionally a second layer contiguous with said outermost layer; and wherein said outermost layer and/or said optional second layer contains a monodiazonium salt capable upon exposure of reducing the conductivity of the exposed parts of said outermost layer relative to the unexposed parts of said outermost layer; and image-wise exposing the material thereby obtaining reduction in the conductivity of the exposed areas relative to non-exposed areas, optionally with a developer.

23. Method according to claim 22, wherein said polymer of a substituted or unsubstituted thiophene corresponds to the following formula:

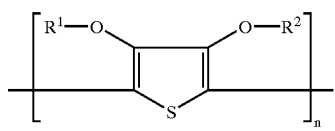

in which n is larger than 1 and each of $R^1$ and $R^2$ independently represent hydrogen or an optionally substituted $C_{1-4}$ alkyl group or together represent an optionally substituted $C_{1-4}$ alkylene group or an optionally substituted cycloalkylene group, preferably an ethylene group, an optionally alkyl-substituted methylene group, an optionally $C_{1-12}$ alkyl- or phenyl-substituted ethylene group, a 1,3-propylene group or a 1,2-cyclohexylene group.

24. Method according to claim 22, wherein said polyanion is poly(styrene sulphonate).

25. Method according to claim 22, wherein said outermost layer further contains a binder.

26. Method according to claim 22, wherein said monodiazonium salt capable upon exposure of reducing the conductivity of the exposed parts of said outermost layer relative to the unexposed parts of said outermost layer is a mono(aryldiazosulphonate) salt.

27. Method according to claim 26, wherein said mono(aryldiazosulphonate) salt is

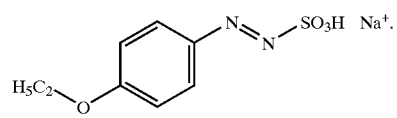

28. Method according to claim 26, wherein said mono(aryldiazosulphonate) salt is

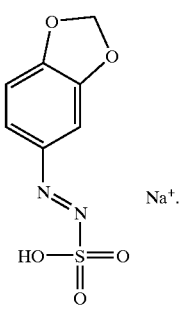

* * * * *